United States Patent [19]
Podgorski

[11] Patent Number: 5,499,200
[45] Date of Patent: Mar. 12, 1996

[54] PROBABILISTIC MODELING OF ELECTROMAGNETIC INTERACTIONS

[76] Inventor: Andrew S. Podgorski, 332 Crestview Road, Ottawa, Ontario, Canada, K1H 5G6

[21] Appl. No.: 62,804

[22] Filed: May 17, 1993

[51] Int. Cl.$^6$ .................................................. G06F 17/00
[52] U.S. Cl. ............................................................ 364/578
[58] Field of Search ................................. 364/578, 485, 364/802, 806, 481; 395/61, 906, 907

[56] References Cited

U.S. PATENT DOCUMENTS

| | | | |
|---|---|---|---|
| 3,999,209 | 12/1976 | Wrigley et al. | 364/485 |
| 5,173,871 | 12/1992 | Dixon et al. | 364/802 |
| 5,253,180 | 10/1993 | Yamagiwa et al. | 364/485 |

OTHER PUBLICATIONS

Lovetri et al; "Evaluation of HARDSYS: A Simple EMI Expert System"; IEEE Aug. 21–23, 1990.
Lovetri et al; "HARDSYS. Applying Expert System Techniques to Electromagnetic Hardening" IEEE May 23–25, 1989.

*Primary Examiner*—Ellis B. Ramirez

[57] ABSTRACT

A probabilistic expert system is provided for detecting the probability of failure of an electrical system where components and environmental effects upon components within the system are modeled by a plurality of nodes which interact with each other. Exponential probability functions provide fuzzy values for the system through which an approximation of the behavior of the system in ranges of low probability of occurrence may be determined. The expert system allows assessment of electromagnetic system protection for the probability of failure as low as $10^{-10}$.

6 Claims, 12 Drawing Sheets

| Frequency (Hz) | Ambient Field Attributes — Lightning Threat (dB mW/m²/Hz) | Susceptibility Attributes — TTL Transistor Susceptibility (dB mW/Hz) |
|---|---|---|
| <$10^2$ | [34, 56, 56, 62] | [-42, -22, -2, 18] |
| $10^2$–$10^3$ | [34, 56, 56, 62] | [-62, -42, -22, -2] |
| $10^3$–$10^4$ | [24, 46, 56, 62] | [-82, -62, -42, -22] |
| $10^4$–$10^5$ | [4, 26, 46, 52] | [-102, -82, -62, -42] |
| $10^5$–$10^6$ | [-28, 6, 26, 34] | [-122, -102, -82, -62] |
| $10^6$–$10^7$ | [-69, -26, -6, 14] | [-142, -122, -102, -82] |
| $10^7$–$10^8$ | [-110, -66, -26, -16] | [-172, -152, -122, -102] |
| $10^8$–$10^9$ | [-147, -107, -67, -50] | [-200, -192, -152, -132] |
| $10^9$–$10^{10}$ | [-186, -146, -106, -90] | [-200, -200, -200, -200] |
| >$10^{10}$ | [-200, -185, -147, -130] | [-200, -200, -200, -200] |

| Frequency (Hz) | Interaction Attributes Shielding (dB) | Interaction Attributes Monopole Antenna (dB m$^{-1}$) |
|---|---|---|
| <10$^1$ | [−15, −17, −17, −19] | [−174, −176, −196, −198] |
| 10$^1$–10$^2$ | [−15, −17, −17, −19] | [−174, −176, −196, −198] |
| 10$^2$–10$^3$ | [−15, −17, −17, −19] | [−154, −156, −176, −178] |
| 10$^3$–10$^4$ | [−15, −17, −17, −19] | [−134, −136, −156, −158] |
| 10$^4$–10$^5$ | [−15, −17, −17, −19] | [−114, −116, −136, −138] |
| 10$^5$–10$^6$ | [−15, −17, −17, −19] | [−94, −96, −116, −118] |
| 10$^6$–10$^7$ | [−15, −17, −30, −32] | [−71, −73, −96, −98] |
| 10$^7$–10$^8$ | [−24, −26, −42, −44] | [−51, −53, −73, −75] |
| 10$^8$–10$^9$ | [−14, −16, −37, −39] | [−34, −36, −53, −55] |
| 10$^9$–10$^{10}$ | [0, −2, −14, −16] | [−41, −43, −60, −62] |
| >10$^{10}$ | [0, 0, 0, 0] | [−48, −50, −60, −62] |

PROBABILISTIC MODELING OF ELECTROMAGNETIC INTERACTIONS

FIELD OF THE INVENTION

The invention relates generally to modeling of electromagnetic phenomena, and more particularly to a method of determining the probability of failure of an electrical system.

BACKGROUND OF THE INVENTION

Since 1988 the Advanced Electromagnetic Protection Group at the National Research Council of Canada has been involved in the development of an Expert System capable of alleviating the complexity of the electromagnetic hardening process, a process that is designed to lower the susceptibility of an electrical system to electromagnetic emission. A first version of the Expert System is called HardSys and is described by Lo Vetri, J., Abu-Hakima, S., Podgorski, A. S., and Costache, G., entitled "HardSys: Applying Expert System Techniques to Electromagnetic Hardening", published May 23–25, 1989 in IEEE 1989 National Symposium on Electromagnetic Compatibility, pp. 383–385, Denver, Co., and was based on an object-oriented knowledge representation.

The concept of the first version of HardSys was based on a minimum spanning tree algorithm taught by E. W. Dijkstra in a publication entitled "A Note on Two Problems in Connexion with Graphs", Numerische, Vol. 1, pp. 269–271, 1959 that allowed calculation of the worst case shielding path for a specified frequency range. Once the worst case shielding path was established and the discrete propagated ambient fields from all nodes were added in parallel, a total propagated ambient field obtained was verified with the total susceptibility of a receiving node, permitting determination of the likelihood of failure. The likelihood of failure was assigned six discrete, linguistic values for each frequency range. It was concluded during the system validation process that in the discrete system definition, even if the ambient field and system susceptibilities discrete scales were divided into more sub-levels, it would be impossible to drastically improve the accuracy of the Expert System or to expand the dynamic range of the likelihood of failures.

A second version of HardSys described by Kass, S. B., entitled "Proposed Enhancements to the HardSys Electromagnetic Hardening Advisor", Internal Report, National Research Council of Canada, Advanced Electromagnetic Protection Group, Ottawa, Canada, Mar. 12, 1991, was based on work intended to overcome the difficulties associated with the implementation of the fixed discrete ambient field and the use of discrete system susceptibility scales and a failure likelihood. The second version of HardSys showed that the implementation of a trapezoidal representation for fuzzy quantities taught by Dubois, D., and Prade, H., in a publication entitled "Possibility Theory, An approach to Computerized Processing of Uncertainty", Plenum Press, New York & London, 1988, assures greater freedom when specifying system attributes and the analysis in terms of fuzzy quantities gives the user a more complete picture of the effects of interaction than that which was based on a fixed linguistic level (good, bad, very good, very bad) for a specified frequency range. A trapezoidal representation of fuzzy quantities improved the accuracy of the analysis for high likelihood of failure; however, it did not allow extension of the dynamic range of the analysis to account for the low likelihood of failure.

SUMMARY OF THE INVENTION

It is an object of the invention to provide a more robust expert system which will allow the probability of a very low likelihood of failure in an electrical system to be determined. Such knowledge is critical for systems that have direct or indirect affect on safety or security.

STATEMENT OF THE INVENTION

In accordance with the invention, a new Expert System is provided, based on a probabilistic approach to modeling of electromagnetic interaction. The system uses a fuzzy-logic with an exponential probability function representation. However, any probability function having positive definite integral in the region extending from − infinity to + infinity such as the gaussian function for example can be used. The applicability of other functions can be verified during testing or through life cycle management.

In accordance with an aspect of the invention, in an electrical system where components and environmental effects upon components within the system are modeled by a plurality of nodes which interact with each other, and where a field generated by a node and the susceptibility off hat node dependent upon its shielding characteristics is determined, and where a most critical path between two of the nodes is determined based on the susceptibility, field generated, and shielding effectiveness, a method of determining the probability of failure of the system is provided, comprising the steps of:

a) determining at least a value corresponding to the electromagnetic coupling between nodes in the critical path;
b) determining at least an ambient field value for each nodes in the critical path;
c) determining at least a susceptibility value for each node in the critical path;
d) determining a probability function which approximates the values in step (a) wherein the probability function is integrable from − to + infinity, with the resulting integral of the probability function being a positive defined number;
e) determining a probability function which approximates the values in step (b) wherein the probability function is integrable from − to + infinity, with the resulting integral of the probability function being a positive defined number;
f) determining a probability function which approximates the values instep (e) wherein the probability function is integrable from − to + infinity, with the resulting integral of the probability function being a positive defined number;
g) locating at least three points on a curve defined by each of the probability functions;
h) determining a fuzzy value from the at least three points located in step (d) for each curve;
i) performing fuzzy mathematical operations such as subtraction, addition, etc. on the values in step (h) representing shielding effectiveness, ambient field and susceptibility to determine the system probability of failure in each of the previously specified frequency ranges.

In yet another aspect of the invention, there is provided a method comprising steps (a) to (f) above and including the steps of:

j) generating sets of random numbers based on the three probability functions determined in steps (d), (e) and (f);
k) using the random numbers from step (j) representing shielding effectiveness, ambient field and susceptibility determined, and performing calculating, the system probability of failure distribution in each of the previously specified frequency ranges; and, (l) integrating the calculated probability distributions in step (k) to determine the system probability of failure in each of the previously specified frequency ranges.

BRIEF DESCRIPTION OF THE DRAWINGS

Exemplary embodiments of the invention will be described in conjunction with the drawings in which.

DETAILED DESCRIPTION

The use of an exponential probability function in a fuzzy-logic Expert System allows a quantitative assessment of system failures for probability of occurrence as low as $10^{-10}$. This in turn permits accurate determination of the protection (shielding) that is required to assure system protection for low probability threats.

Electromagnetic Topology Representation

Electromagnetic Hardening is defined as a process directed towards lowering the susceptibility of electronic systems to electromagnetic emissions. A system is considered electromagnetically hardened when the susceptibility level of the system is lower than the maximum level of electromagnetic disturbances. The system susceptibility level refers to the minimum level of received electromagnetic disturbance Which will result in a system failure or upset. The susceptibility of the system is inversely proportional to the level of disturbance causing upset or damage.

The hardening process is accomplished by subdividing the electronic system into several subsystems so that the levels of disturbances and susceptibilities of the subsystems can be verified.

The use of methodical approach to system representation and subdivision taught by Baum, C. E., in publications entitled; "Electromagnetic Topology, A Formal Approach to the Analysis and Design of Systems", Interaction Notes, Note 400, Air Force Weapons Lab, September, 1980, and "On the Use of Electromagnetic Topology for Decomposition of Scattering Matrices for Complex Physical Structures", Interaction Notes, Note 454, Air Force Weapons Lab, July, 1985, resulted in formulating the electromagnetic shielding topology for an electronic system as presented in FIG. 1, and assigning to it of an electromagnetic interaction graph as presented in FIG. 2. The use of this approach allows an accurate modeling of the interaction between the different segments of the electromagnetic system.

Figure 1:
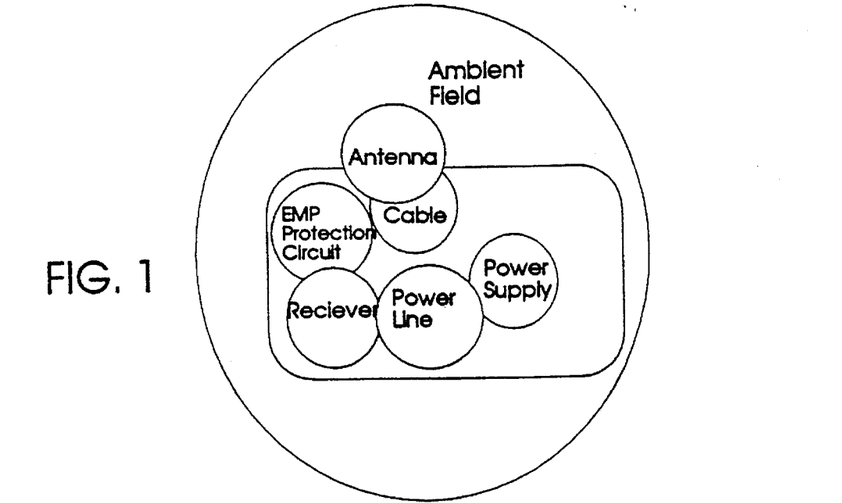
FIG. 1 is a graphical volume shielding representation of a simple system in accordance with the topological approach.
Figure 2:
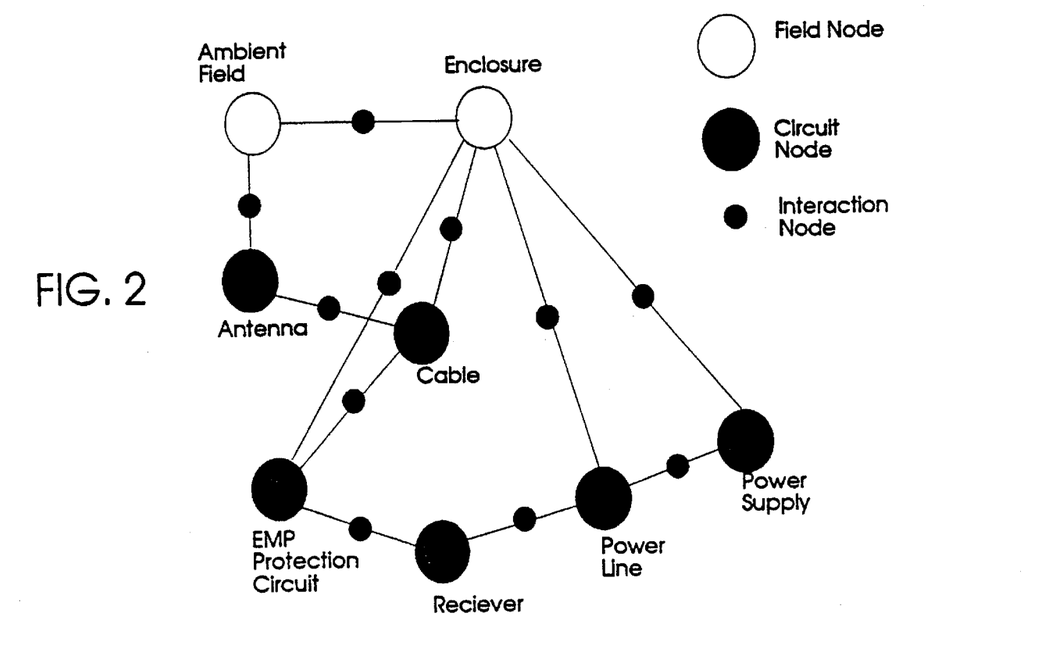
FIG. 2 is a graphical electromagnetic interaction representation of a simple system of FIG. 1 formulated in accordance with the topological approach.

FIGS. 1 and 2 indicate that field and circuit nodes of the interaction graph take on the properties of the volumes in the system. Surface between the volumes represent the interaction nodes in the interaction graph. The volumes in the graph can have two properties. The first property addresses the level of electromagnetic emission radiated from the volume and is called ambient field (AF) caused by the field or circuit emission. The field emission is defined in terms of power spectral density defined in units of decibel milliwatt per square meter hertz and circuit emission in decibel milliwatt per hertz respectively.

The second property of a volume is its susceptibility to environmental electromagnetic emission known as system susceptibility (SS). The SS can be rated in terms of power spectral density, depending on whether the node is a field or a circuit node.

With assigned directions of propagation between two volumes, the coupling level between two volume is characterized by shielding effectiveness (SE) between nodes. AF, SS, and SE concepts are used to form a model of the interaction that takes place in the hardening process. Using this model one needs to calculate a critical coupling path in order to allow the propagation of the ambient fields into the most susceptible nodes. The comparison of the propagated ambient fields with the susceptibility at each of the systems nodes permits the assessment of the system hardening level. To perform the calculation one must assign values to all SE, AF, and SS in the entire system.

System Attributes Representation

The attributes of field nodes, circuit nodes and the interaction nodes as shown in FIG. 2, are defined in the frequency domain and are specified in quantized frequency ranges. A normalization procedure is performed that assures that the attributes propagating through the whole system can be specified over different frequency ranges and still be correctly interpreted.

Each volume, field and circuit node in the topology of FIG. 2 can contain a plurality of disturbances. To determine the magnitude of the disturbance defined as an ambient field (AF), all the disturbances are normalized infrequency and added in parallel.

Each volume circuit node in the electromagnetic topology of FIG. 2 may also contain many associated system susceptibilities. To establish a worst system susceptibility, the specific system susceptibilities of each of the nodes are normalized in frequency and added in parallel. Each interaction node is represented by the attenuation and shielding effectiveness and may be made up of many different paths connected in parallel. Each of these paths is normalized in frequency and added in parallel to establish a worst shielding effectiveness node. The type of the interaction node depends on the types of the two nodes connected. Four basic interaction nodes can be identified; the field- node, the circuit-node, the circuit-field node, and the field-circuit node.

Figure 3:
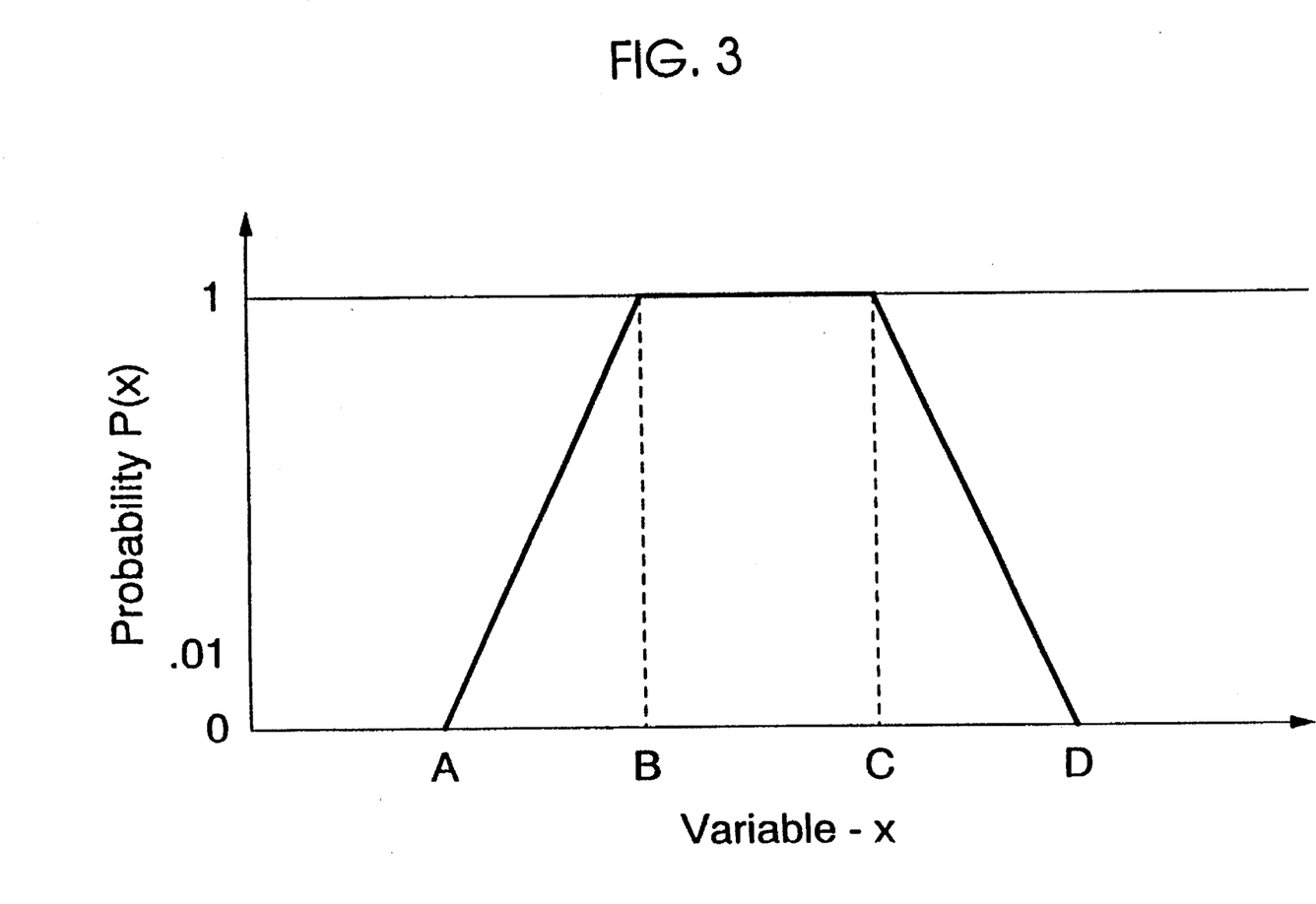
FIG. 3 is a prior art trapezoidal representation of fuzzy values.

In the prior art, all of the attributes of the field, circuit, and interaction nodes are represented by pre-defined fixed ranges with linguistic labels or by fuzzy values described by trapezoidal function as can be seen in FIG. 3. The trapezoidal representation of FIG. 3 did not support estimation of the low likelihood values of attributes close to zero by assuming that the probability distribution function reaches zero not at infinity but for a final value of the variable. The trapezoidal representation of attributes results in higher flexibility in defining the input parameters for the model over the linguistic discrete representation; however, it did not permit an accurate calculation of the final results for a low probability of occurrence.

To assure a probabilistic representation of the results at the end of the assessment of the hardening process in accordance with this invention, each of the attributes of the model is defined by a newly created algorithm which is a part of this invention. This new algorithm is based on a fuzzy variable representation developed by Dubois, D., and , H., who in the publication entitled "Possibility Theory, An approach to Computerized Processing of Uncertainty", Plenum Press, New York & London, 1988 and introduced into this invention with the addition of the probabilistic approach.

The new probabilistic representation of fuzzy values presented here is defined by the probability function described by the following equation:

$$P(x) = \begin{cases} e^{-k_1(x-B)^2} & \text{for } x < B \\ 1 & \text{for } B \leq x \leq C \\ e^{-k_2(x-C)^2} & \text{for } x > C \end{cases} \quad (1)$$

where $$k_1 = \frac{-\ln(P(A))}{(A-B)^2}$$

$$k_2 = \frac{-\ln(P(D))}{(C-D)^2}$$

and $$P(A) = P(D) = 0.01$$

Figure 4:
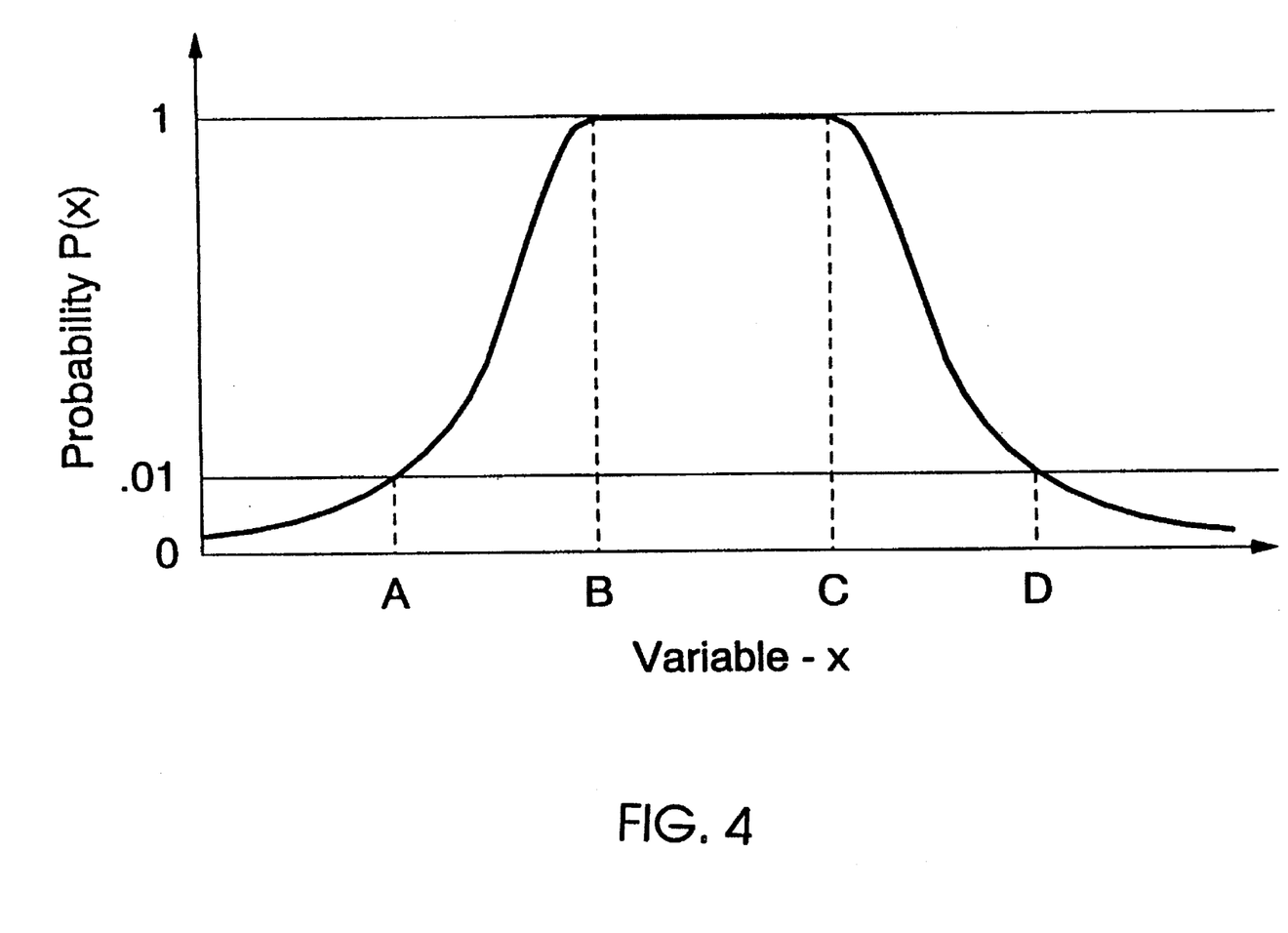
FIG. 4 is a probabilistic (exponential) representation of fuzzy values in accordance with the invention.

FIG. 4 shows a representation of the probability function specified by Equation 1. FIG. 4 shows that the use of an exponential probability function, rather than a conventional trapezoidal representation of the fuzzy system proposed by Dubois and Prade and presented in FIG. 3, allows elimination of discontinuities at points A and D of the trapezoidal representation. The use of exponential representation of fuzzy variables allows characterization of attributes at extremely low probabilities of occurrence. Such low probabilities are encountered during hardening of very high quality products or, in the case of systems that have direct and in-direct effect on safety or security, and where even low probability of failure can not be tolerated. In FIG. 4, the values of the variables at the points A and D correspond to the minimum of the low 1% and the high 1% probabilities respectively. The 1% value is chosen arbitrary because of the availability of usable statistical data. The selection of the 1% level for points A and D resulted from the fact that presently it is very difficult to estimate the probability of EM threat at much lower than level 1% of occurrence. In the future, this value can be adjusted to accommodate new available data and to improve system modeling accuracy.

Points B and C correspond to a lower and upper limits of the mean (50%) value of the variable in the specified frequency region.

The use of the exponential probability function with strict rules for defining points ABCD of the fuzzy representation resulted in well-organized input of probabilistic data into the model.

Figure 6:
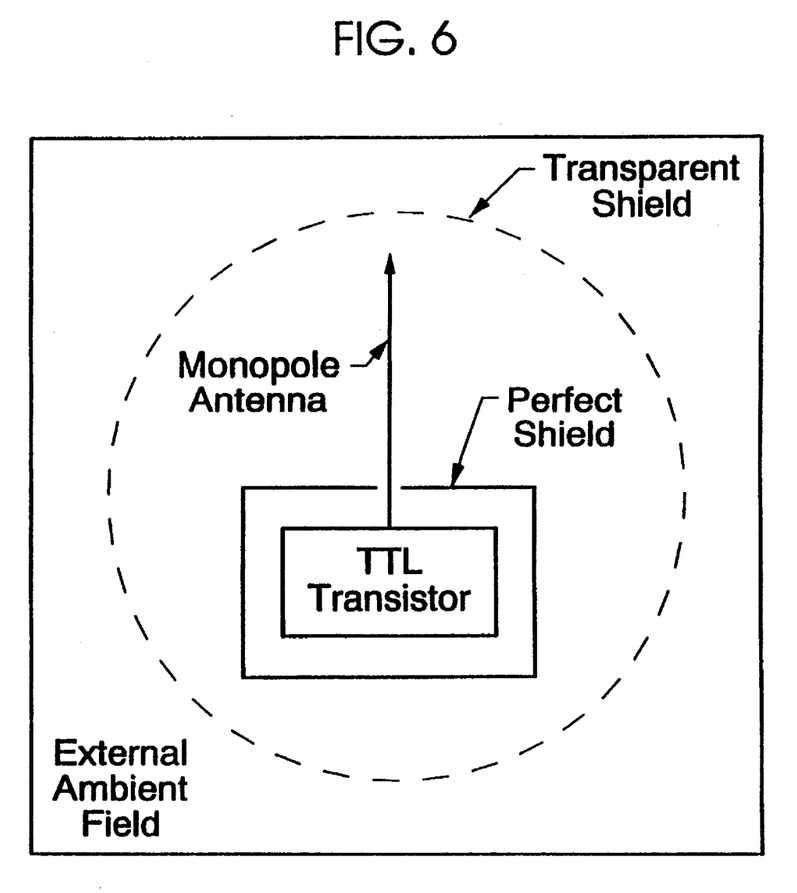
FIG. 6 is a graphical volume shielding representation of a topology of a simple TTL transistor based system.

To illustrate the way system attributes are generated according to this invention a small system based on a TTL transistor with a topology presented in FIG. 6 is assembled and tested. The system consists of a monopole antenna connected into a TTL transistor housed in a perfectly shielded enclosure. The whole arrangement (antenna and TTL transistor) is housed in a transparent shield subjected to an external ambient field. The interaction graph of topology of FIG. 6 is presented in FIG. 7. The procedure for this nodal representation is described heretofore.

Figure 7:
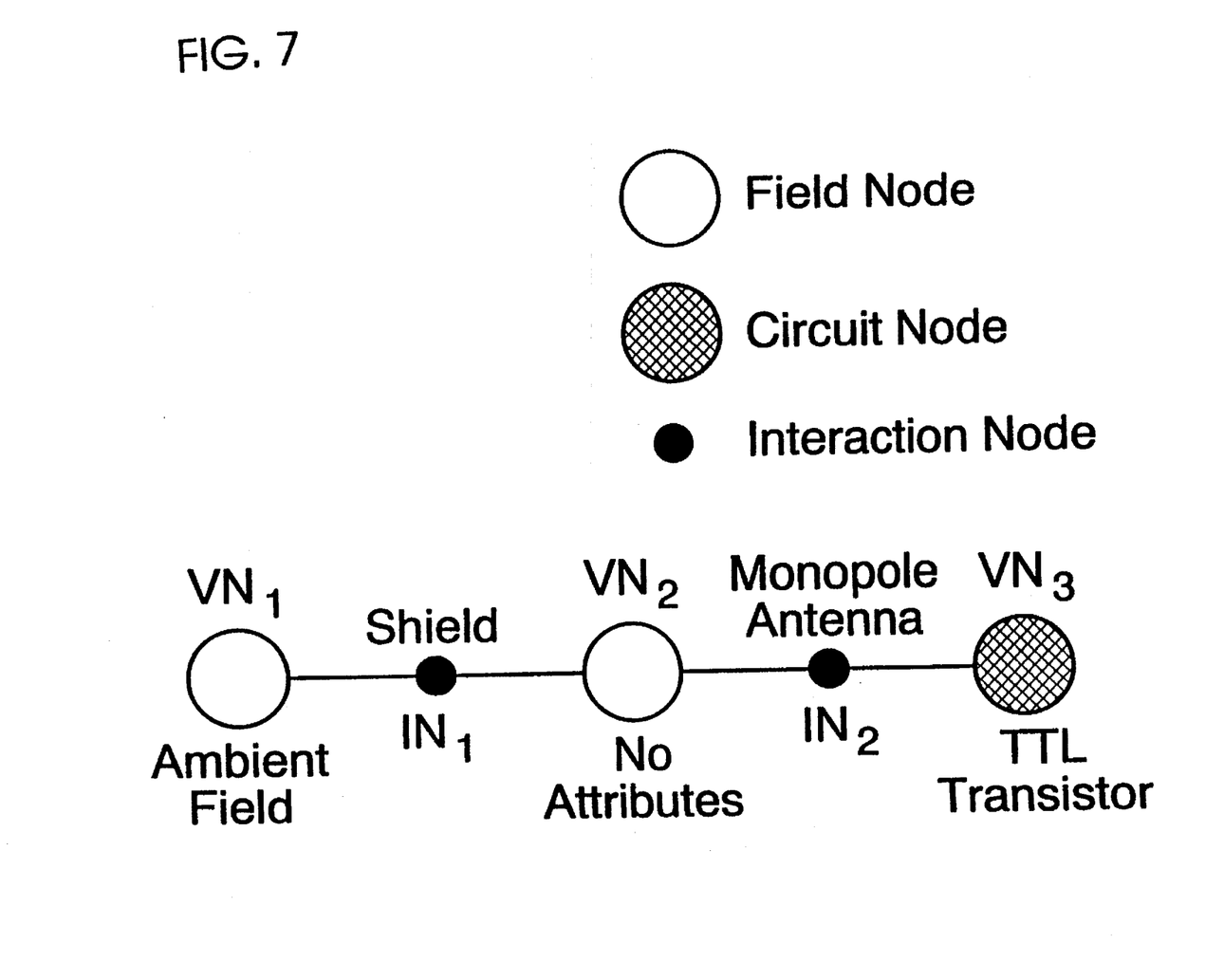
FIG. 7 is a graphical electromagnetic interaction representation of a simple TTL transistor based system of FIG. 6.

The attributes of the field, circuit and the interaction nodes of FIG. 7 are established in a process described below.

A detailed description of this process is as follows:

The three volume nodes of FIG. 7 represent the Ambient Field (VN1) describing the external EM threats, the empty node (VN2) describing the field inside the transparent enclosure, and the circuit node (VN3) describing the TTL transistor.

For the volume node VN1, the Ambient Field parameters consist of the lightning threat. The ABCD attributes for the first volume mode VN1 of FIG. 7 were obtained from the lightning threat represented by FIG. 8. The graph of FIG. 8 represents an example of direct lightning threat to an aircraft in flight and on the ground and is based on work of the applicant entitled "Lightning Standards for Aircraft Protection", Proc. 1990 IEEE International Symposium on EMC, pp. 218–223, Washington, DC, Aug. 21–23, 1990.

Figure 8:
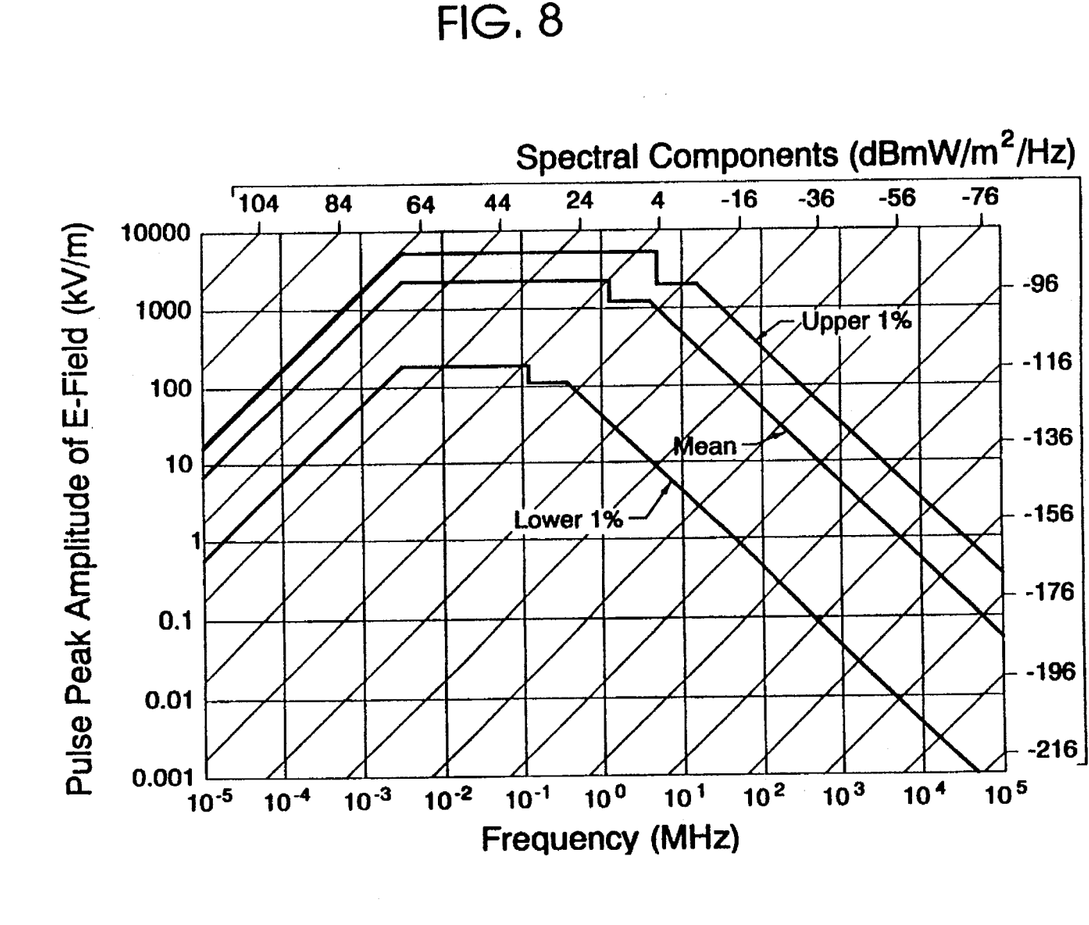
FIG. 8 is an example of a graphical visualization of a lightning electromagnetic threat represented through the peak amplitude and spectral components of an electric field.

The middle curve of FIG. 8 represents the mean value of lightning threat. The upper curve represents the threat for 1% of cases, and the lower curve represents the threat for 99% of cases.

The lower, upper, and mean values defining the lightning threat are based on measurements at tall and short towers and measurements on aircraft. The peak value of the electric field represented in FIG. 8 was estimated for the direct lightning strike to the structure of assumed 1 m radius and assumed wave impedance of 300 ohms.

For the low peak current values, a linear relationship between the current and field is assumed. However, for the high peak current values, the effect of ionization limits the field peak value to the maximum level of 3 MV/m.

The values of attributes ABCD are listed in Table 1 were determined from FIG. 8 for each frequency decade. The frequency range on FIG. 8 extends from 100 Hz to 100 GHz and is divided arbitrarily into 10 decades. Even this arbitrary division allows reasonably accurate prediction of the failure probability. Further division to more frequency regions will increase the accuracy of failure prediction; however, it will also result in an increase of required computation time. The fuzzy value A was established by determining the minimum value of spectral components of the lower 1% curve. The fuzzy values B and C correspond respectively to the minimum and maximum spectral components values of mean curve in the specified frequency decade. The value D corresponds to the maximum value of the upper 1% curve. The assignment of values ABCD was purposely made not arbitrary. By letting $$p(A)=p(B)=1\%$$

it is possible to provide an accurate measurement of low level probabilities. It is obvious that allowing the probabilities to be defined at the 1% level leaves one open to an error at lower and higher probabilities. However, those errors will have to be analyzed at a later date when more information about the failures of the hardened systems will be available.

The second volume node (VN2) was included to allow for the insertion of a shield between the Ambient Field and the Monopole Antenna. This node does not have any field or susceptibility attributes.

Figure 9:
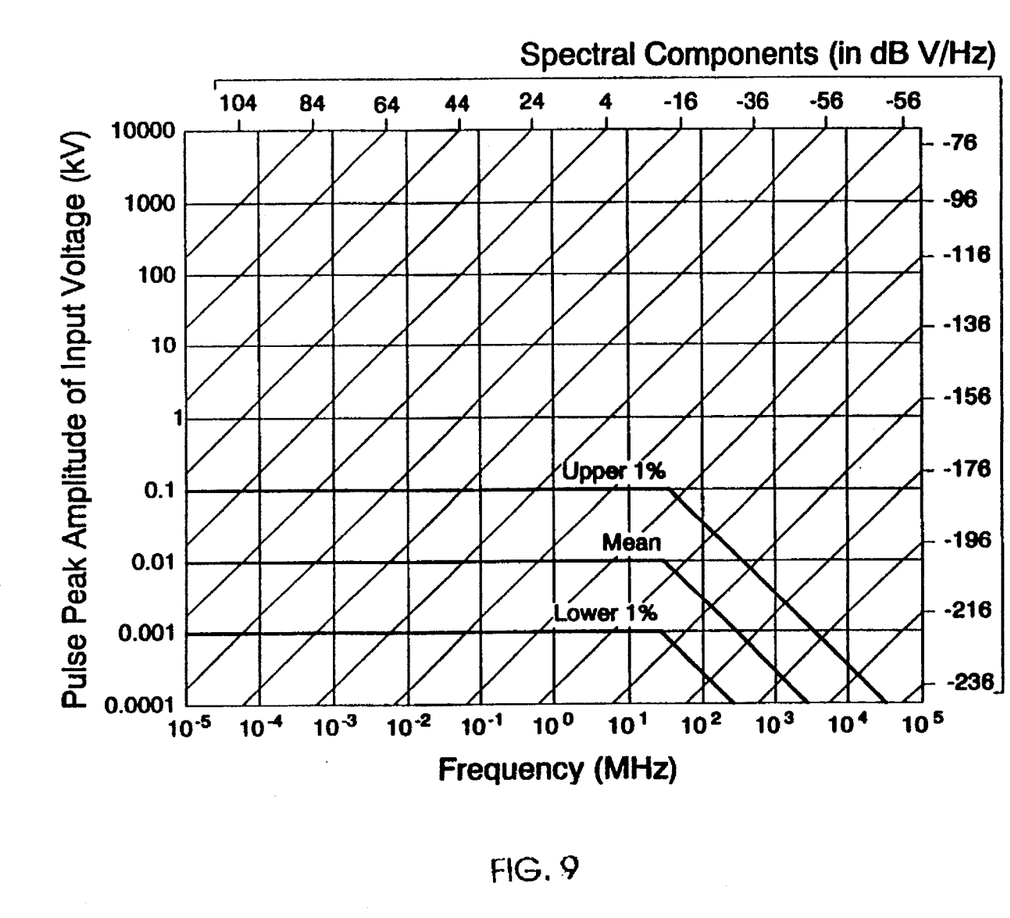
FIG. 9 is an example of a graphical visualization of the susceptibility of the TTL transistor represented through the peak amplitude and spectral components of the input voltage.
Figure 10:
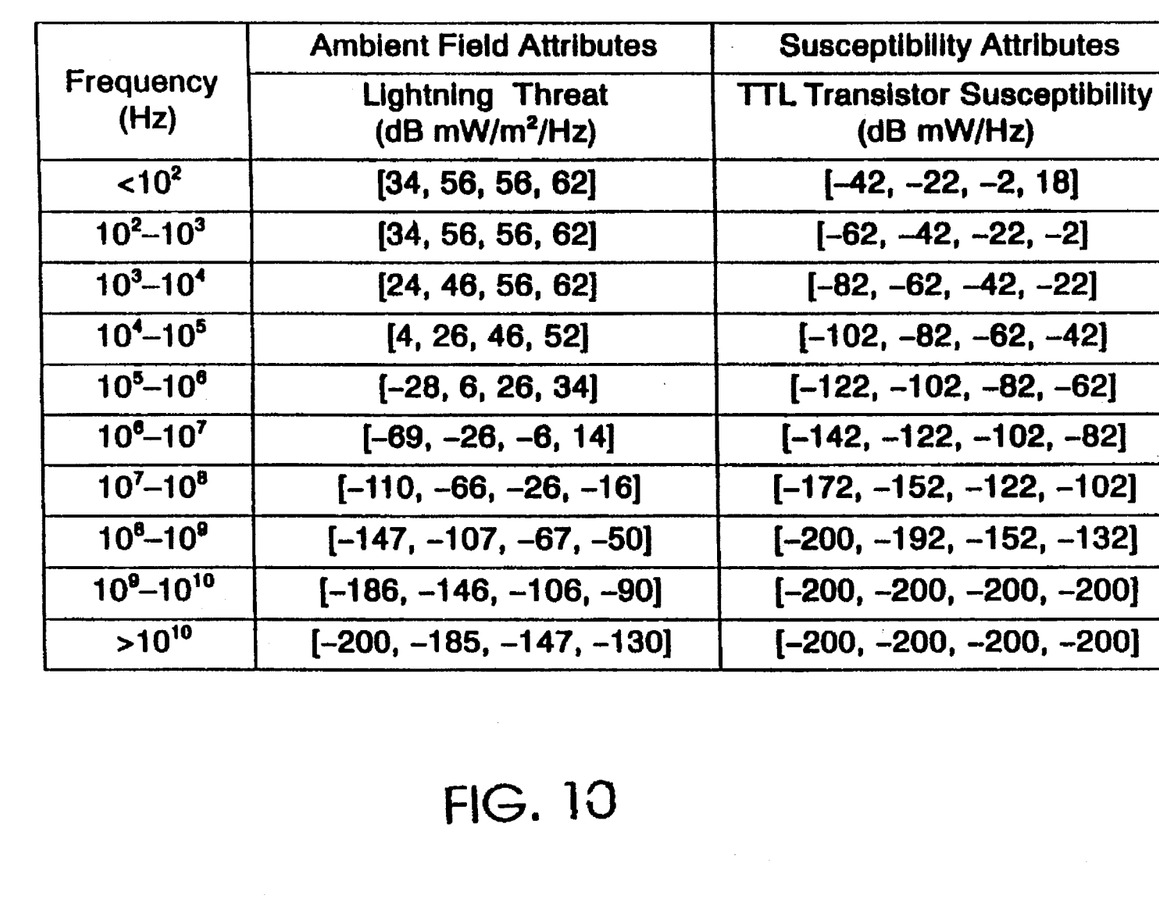
FIG. 10 is a table of fuzzy values, obtained from graphs in FIGS. 8 and 9, defining the lightning generated ambient field and susceptibilities of the TTL transistor.

The third volume node (VN3) represents the TTL transistor and is represented only by the susceptibility attributes. The TTL transistor susceptibility attributes were defined with the use of FIG. 9. In FIG. 9, the fuzzy values of the transistor susceptibility were determined in respect to the peak signal amplitudes of 1 V, 10 V, and 100 V, corresponding to the lower 1%, mean, and upper 1% of cases. The bandwidth of the TTL transistor was assumed to be 27 MHz. The values of ABCD parameters defining the TTL transistor susceptibility attributes for the volume node VN3 of FIG. 7 are summarized in FIG. 12. The fuzzy value A was established by determining the minimum value of spectral components of the lower 1% curve. The fuzzy values B and C correspond respectively to the minimum and maximum spectral components values of mean curve in the specified frequency decade. The value D corresponds to the maximum value of the upper 1% curve.

Figure 11:
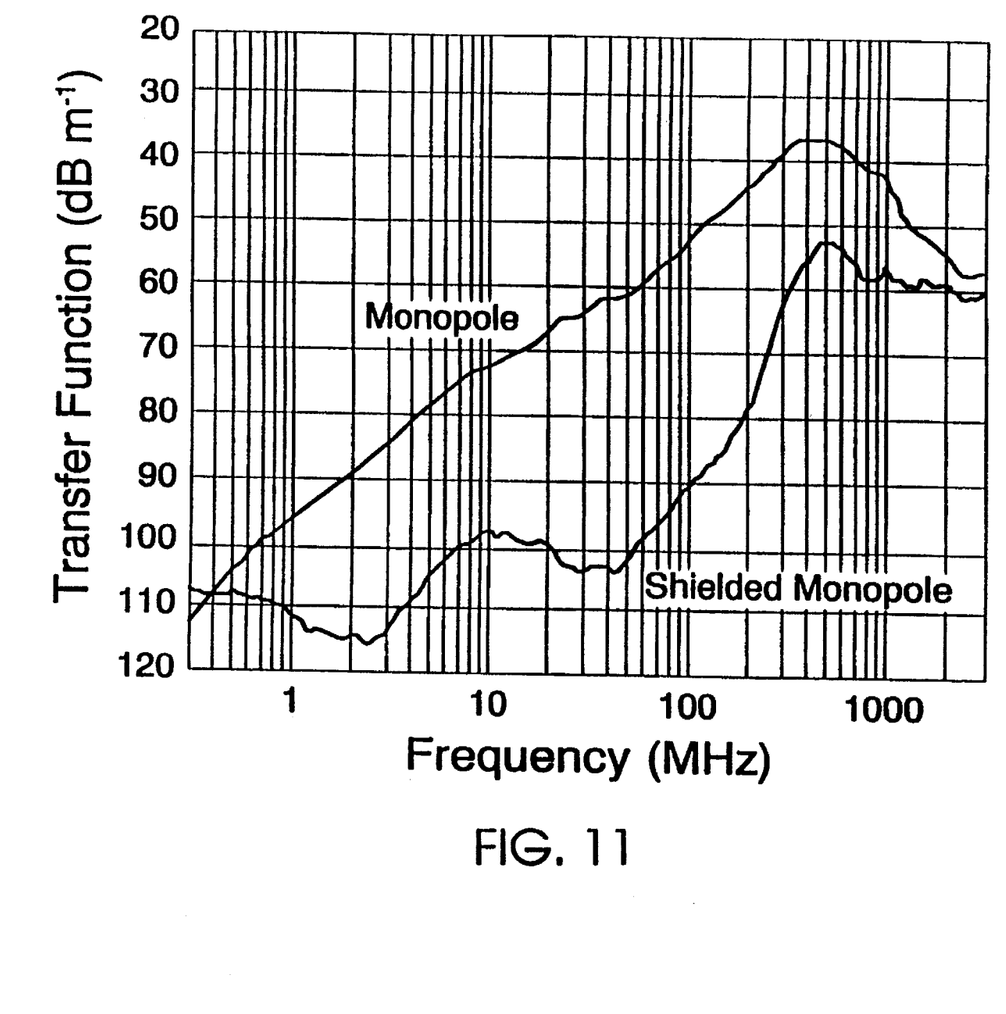
FIG. 11 is a graphical representation of the measured transfer function, between the ambient field E (V/m) and the voltage at a 50 ohm output of a monopole antenna and the shielding effectiveness of the transparent shield.

The IN1 is the interaction node representing the shielding effectiveness of the semi-transparent shield and the IN2 is the interaction node representing the gain of the monopole antenna. The measurements (characterization) of the interaction nodes were conducted in a Broadband Gigahertz Field Facility and are represented by FIG. 11. FIG. 11 displays the measured transfer function between the Ambient Field E (volts/meter) and the voltage V (volts) at the 50 ohm output of the Monopole Antenna. FIG. 11 was used to define the ABCD parameters of the interaction nodes (see FIG. 7) between the Ambient Field and the Shield, and the Shield and the Monopole Antenna.

Figure 12:
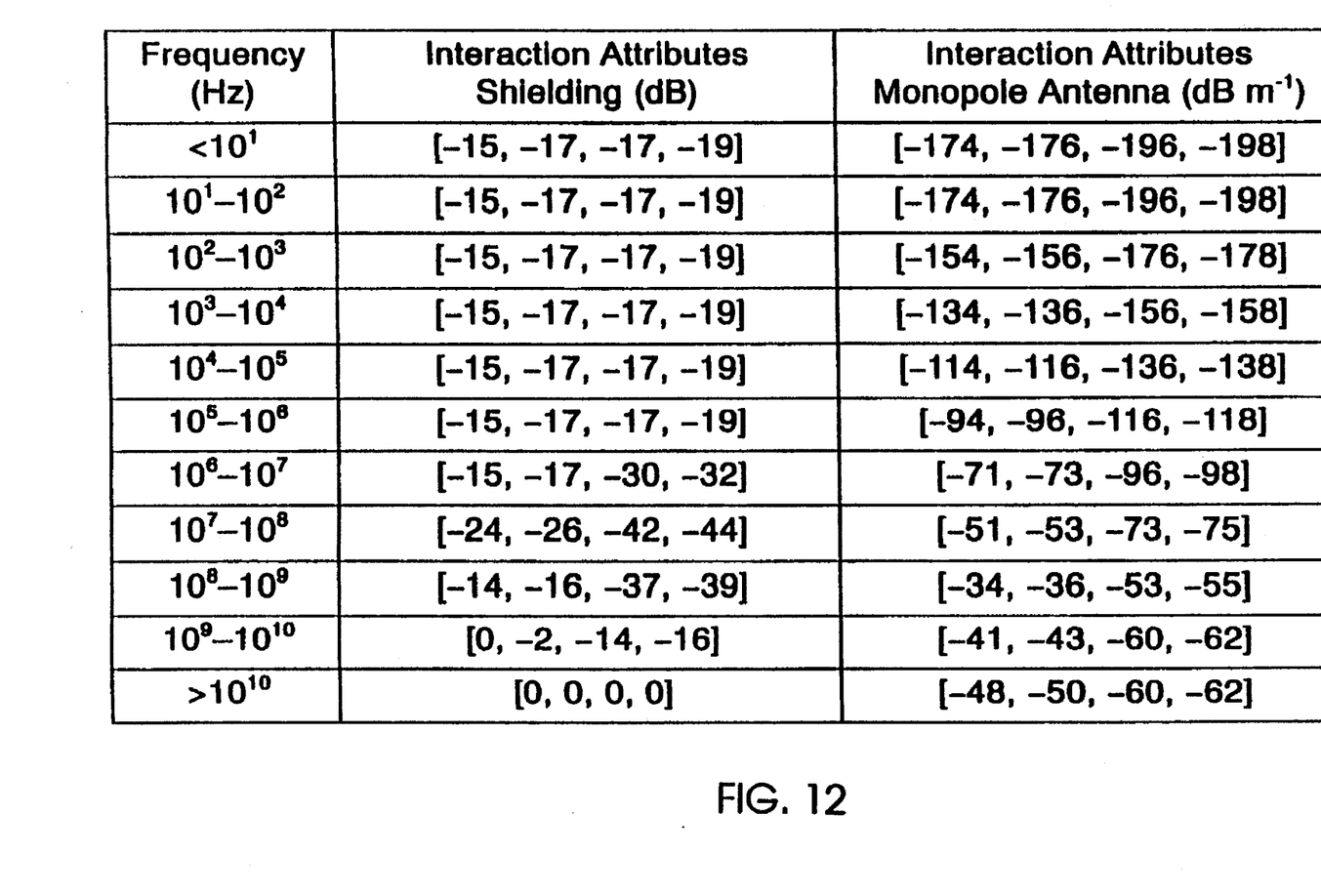
FIG. 12 is a table of fuzzy values, obtained from graph in FIG. 11, defining the shielding interaction attributes of a transparent shield around the monopole antenna and the coupling interaction attributes of the monopole antenna itself; and, FIG. 13 is a graphical representation of the calculated probability of failures resulting from a direct lightning strike into a TTL transistor based system of FIG. 6.

The fuzzy values B and C, corresponding to the minimum and maximum values of transfer function in each of the 10 decades of frequencies, were mad from FIG. 11. The values A and D were arbitrarily assigned value −2 dB lower than B and C. In the system the value of −2 dB corresponds to the 1% to 99% accuracy of the measured transfer functions. FIG. 12 summarizes the estimated from FIG. 11 values of the interaction parameters in all previously defined frequency ranges.

Once attributes for the simplified verification system of FIG. 6 are defined it is possible to calculate the probability of failure for the lightning threat.

EM Hardening Algorithm

With the electromagnetic topology defined and the specific electromagnetic attributes assigned, the probability of failure can be determined at the susceptible nodes by propagating the electromagnetic disturbance from emitting nodes to susceptible nodes through the worst-case shielding paths (Dijkstra algorithm).

Then the propagating ambient field (AFp) is calculated for each susceptible node by subtracting the total shielding effectiveness from the total ambient field.

$$AF_p = AF_t \ominus SE_t \qquad (2)$$

This subtraction is done using the fuzzy subtraction operation $$f \ominus g = (A_f - D_g, B_f - C_g, C_f - B_g, D_f - A_g) \qquad (3)$$

where $$f(A_f, B_f, C_f, D_f) \text{ and } g(A_g, B_g, C_g, D_g)$$

are functions defined by parameters ABCD.

In the case where multiple paths of equal values between the emitting and the susceptible nodes exist, all of the ambient fields AFp1, AFp2 . . . , AFpn propagating through the different paths are added using the fuzzy addition algorithm.

$$f \oplus g = (A_f + A_g, B_f + B_g, C_f + C_g, D_f + D_g) \qquad (4)$$

where $$f(A_f, B_f, C_f, D_f) \text{ and } g(A_g, B_g, C_g, D_g)$$

The addition of ambient fields allows calculation of the total propagating ambient field for each frequency range as per Equation 5.

$$AF_p = \oplus AF_{pn} = AF_{pn} = AF_{pi} \oplus AF_{pi} \ldots AF_{pn} \qquad (5)$$

Once all the propagating ambient fields are calculated, the probability of failure can then be calculated at each node by subtracting the susceptibility (SS) from the calculated total AFp.

$$PF = AF_p \ominus SS \qquad (6)$$

Figure 5:
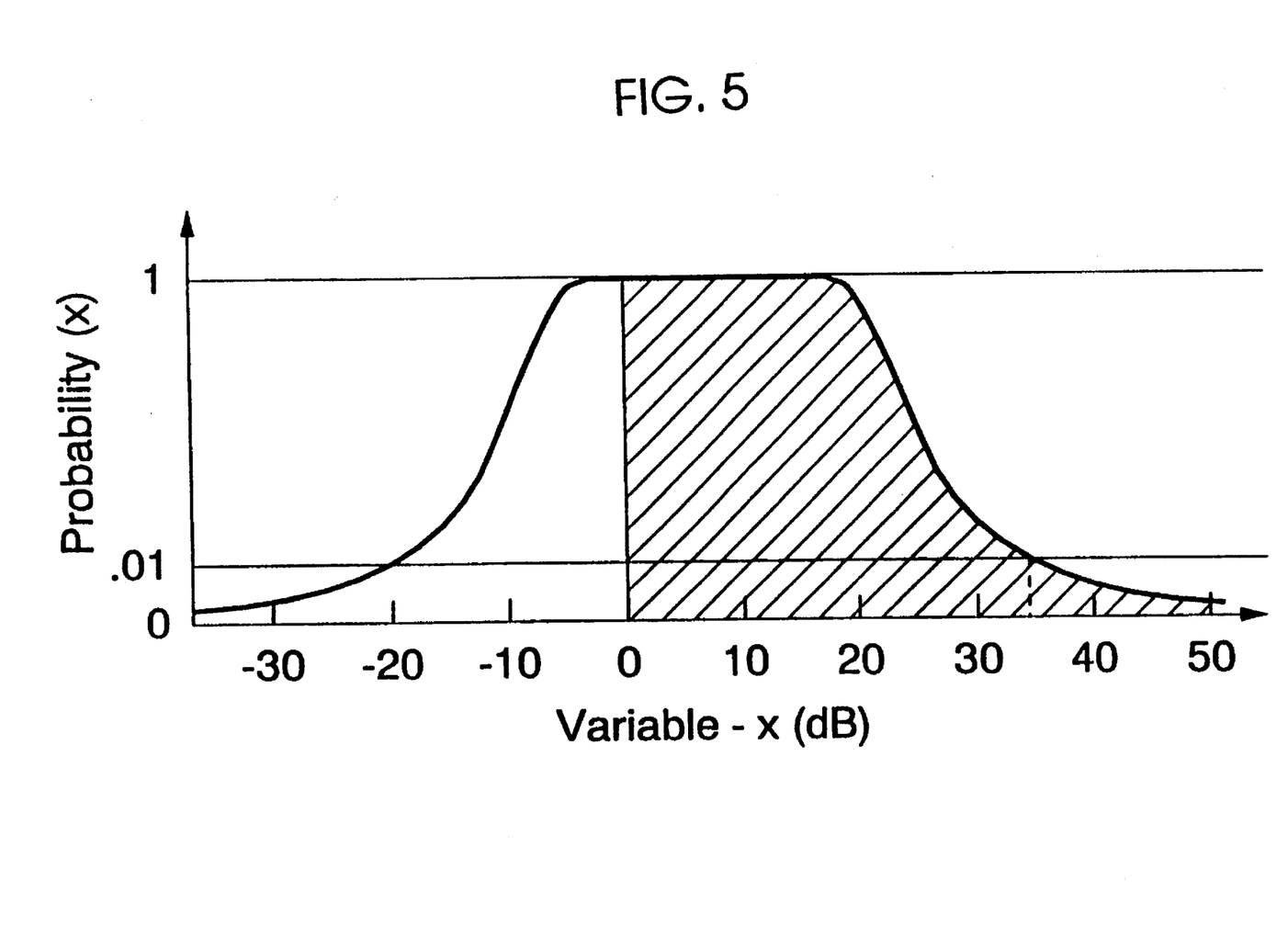
FIG. 5 is a graphical representation of a method for calculating the probability of failure from a probability distribution defined by a probability function as shown in FIG. 4.

Parameters ABCD given by Equation 6 can then be used to calculate the probability density function as per Equation 1. The calculation of the probability of failure can be done from Equation 7; the integration regions specified by Equation 7 are shown in FIG. 5.

$$P = \frac{\int_0^\infty PF(x)dx}{\int_{-\infty}^\infty PF(x)dx} \; 100\% \qquad (7)$$

By choosing an appropriately large area of integration one can theoretically expand the calculation of total probability into extremely small or large values. Using the probability algorithm given by Equation 7, we were able to assess the electromagnetic system protection for the probability of failure as low as $10^{-10}$.

Figure 13:
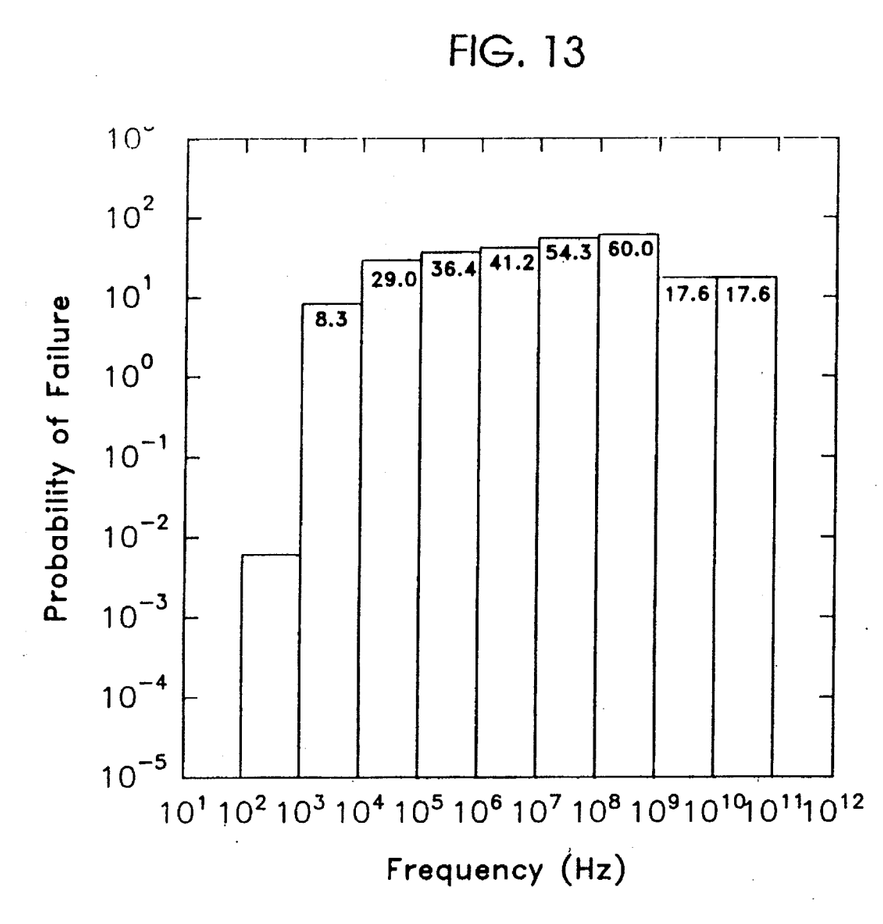

FIG. 13 shows the graphical representation of such calculation. FIG. 13 shows that the direct lightning strike alone, with its spectral components extending from 1 MHz to 1 GHz, can result in system probability of failure as high as 60% for unprotected system.

Numerous other embodiment may be envisaged without departing from the scope of this invention.

What I claim is:

1. In an electrical system where components and environmental effects upon components within the system are modeled by a plurality of nodes which interact with each other, and where a field generated by a node and the susceptibility of that node dependent upon its shielding characteristics is determined, and where a most critical path between two of the nodes is determined based on the susceptibility, field generated, and shielding effectiveness, a method of determining the probability of failure of the system comprising the steps of:

a) determining at least a value corresponding to the electromagnetic coupling between nodes in the critical path;

b) determining at least an ambient field value for each nodes in the critical path;

c) determining at least a susceptibility value for each node in the critical path;

d) determining a probability function which approximates the values in step (a) wherein the probability function is integrated from minus infinity to plus infinity, a resulting integral of the probability function being a positive defined number;

e) determining a probability function which approximates the values in step (b) wherein the probability function is integrable from minus infinity to plus infinity, a resulting integral of the probability function being a positive defined number;

f) determining a probability function which approximates the values in step (c) wherein the probability function is integrable from minus infinity to plus infinity, a resulting integral of the probability function being a positive defined number;

g) locating at least three points on a curve defined by each of the probability functions;

h) determining a fuzzy value from the at least three points located in step (g) for each curve;

i) performing fuzzy subtraction of the values in step (h) representing shielding effectiveness, ambient field and susceptibility;

j) determining a probability function PF(x) of upset or damage of the whole system wherein the probability function is integrable from minus infinity to plus infinity, a resulting integral of the probability function being a positive defined number;

k) adjusting the shielding or the system to reduce said positive defined number to an acceptable value.

2. The method defined in claim 1 wherein the probability function which approximates the values is an (exponential) experimentally defined function.

3. The method defined in claim 2 wherein the system upset or damage probability can be calculated (function is of the form):

$$P = \frac{\int_{0}^{\infty} PF(x)dx}{\int_{-\infty}^{\infty} PF(x)dx} * 100\%.$$

where the function PF(x) is determined in step J where B and C correspond to lower and upper limits of a mean values of the variable x in a predetermined frequency region; and where A and D correspond to a predetermined minimum and maximum percentage of probability of occurrence of variable x in a predetermined frequency region.

4. The method as defined in claim 1 wherein the determination steps (a), (b), and (c) are performed by one of measuring and selecting the values.

5. The method of claim 3 where if the determined probability is higher than acceptable, the electromagnetic coupling between nodes in the critical path and/or susceptibility for the nodes in the critical path have to be increased until the system upset or damage probability will be lower than acceptable value.

6. The method of claim 3 where the system in which the upset or damage probability defined will be lower than acceptable value, has its components protected against the environmental effects.

* * * * *